(12) United States Patent
Jones et al.

(10) Patent No.: US 7,020,728 B1
(45) Date of Patent: Mar. 28, 2006

(54) PROGRAMMABLE SERIAL INTERFACE

(75) Inventors: Christopher W. Jones, Pleasanton, CA (US); Andrew J. Wright, Mountain View, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 517 days.

(21) Appl. No.: 09/904,750

(22) Filed: Jul. 13, 2001

(51) Int. Cl.
*G06F 13/14* (2006.01)

(52) U.S. Cl. .................. 710/305; 710/306; 326/41; 326/37; 370/359; 370/419

(58) Field of Classification Search ............... 710/305, 710/306; 711/154; 326/38–41; 370/208–210, 370/359, 419
See application file for complete search history.

(56) References Cited

U.S. PATENT DOCUMENTS

| | | | |
|---|---|---|---|
| 5,394,031 A * | 2/1995 | Britton et al. ............... 326/38 |
| 5,654,650 A * | 8/1997 | Gissel .......................... 326/38 |
| 5,914,933 A * | 6/1999 | Cimini et al. ................ 370/208 |
| 6,215,689 B1 * | 4/2001 | Chhor et al. .................. 365/63 |
| 6,404,225 B1 * | 6/2002 | Rangasayee ................. 326/39 |
| 6,545,505 B1 * | 4/2003 | Chan et al. .................... 326/41 |
| 6,696,855 B1 * | 2/2004 | Kapusta et al. ............... 326/39 |
| 6,735,291 B1 * | 5/2004 | Schmid et al. .............. 379/189 |
| 2003/0191910 A1 * | 10/2003 | Matsunami et al. ........ 711/154 |
| 2004/0032282 A1 * | 2/2004 | Lee et al. ..................... 326/39 |

* cited by examiner

*Primary Examiner*—Rehana Perveen
*Assistant Examiner*—Kim T. Huynh
(74) *Attorney, Agent, or Firm*—Christopher P. Maiorana, PC

(57) ABSTRACT

A programmable serial interface device. The device generally comprises a programmable logic device and another die mounted to an assembly apparatus. The programmable logic device may comprise (i) a plurality of logic block clusters and (ii) a plurality of routing channels configured to interconnect said logic block clusters. The die may comprise a first communication channel (i) configured to convert between a first serial data signal and a first parallel data signal and (ii) coupled to a first of the routing channels to exchange the first parallel data signal with at least one of the logic block clusters.

22 Claims, 4 Drawing Sheets

PROGRAMMABLE SERIAL INTERFACE

FIELD OF THE INVENTION

The present invention relates to a method and/or architecture for point-to-point communication devices generally and, more particularly, to a programmable serial interface.

BACKGROUND OF THE INVENTION

Point-to-point and point-to-multipoint communication devices allow for a transfer of data signals over high-speed serial links. Each transmit channel of the communication devices receives parallel data signals at an input, converts the parallel data signal to a serial data signal and transmits the serial data signal to a receiving channel. Each receiving channel of the communication devices receives the serial data signal from a transmit channel, converts the serial data signal back into the parallel data signal and presents the parallel data signal.

Pre-transmission processing and post-reception processing of the parallel data signals are conventionally performed outside the communication device in additional circuitry. Examples of processing performed by the additional circuitry include framing/de-framing, header insertion/removal, error encoding/detection and byte stuffing/de-stuffing. The presence of the additional circuitry consumes space, power and cost while decreasing reliability.

One approach to improve the space, power and reliability factors is designing an application specific communication device with built-in pre-transmission processing and the post-reception signal processing. Disadvantages of the application specific approaches include increased design costs and fixed signal processing functionality. What is desired is a low-cost communication device where the signal processing is programmable to adapt to a wide variety of applications.

SUMMARY OF THE INVENTION

The present invention concerns a programmable serial interface device. The device generally comprises a programmable logic device and another die mounted to an assembly apparatus. The programmable logic device may comprise (i) a plurality of logic block clusters and (ii) a plurality of routing channels configured to interconnect said logic block clusters. The die may comprise a first communication channel (i) configured to convert between a first serial data signal and a first parallel data signal and (ii) coupled to a first of the routing channels to exchange the first parallel data signal with at least one of the logic block clusters.

The objects, features and advantages of the present invention include providing a method and architecture for a communication device that may be (i) low cost, (ii) programmable, (iii) high speed and/or (iv) a single package device.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
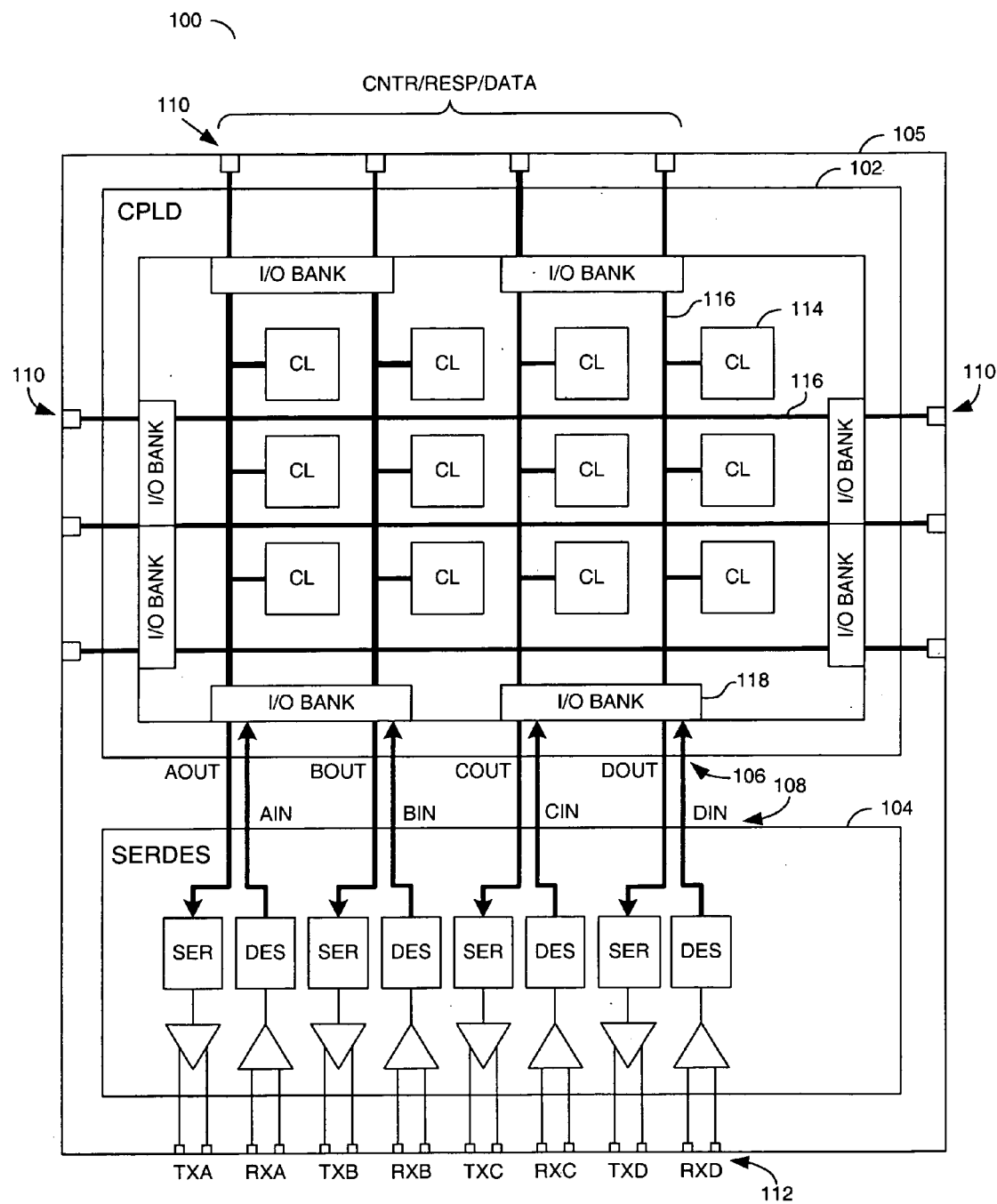
FIG. 1 is a block diagram of a device implementing the present invention.

Referring to FIG. 1, a block diagram of a device 100 is shown in accordance with a preferred embodiment of the present invention. The device 100 generally comprises a circuit (or die) 102 and a circuit (or die) 104 mounted on an assembly apparatus 105. The circuit 102 may be implemented as a programmable die and the circuit 104 may be implemented as a serial communication die. For example, the circuit 102 may be implemented as a logic device, a complex programmable logic device (CPLD), a field programmable gate array, or the like. The circuit 104 may be implemented as a point-to-point communication device, a point-to-multipoint communication device, a serial transceiver, or the like. For the purposes of illustrating the present invention, the circuit 102 may hereinafter be referred to as a CPLD 102. The circuit 104 may hereinafter be referred to as a serialization/deserialization circuit or SERDES 104 for short. The assembly apparatus 105 may be implemented as a ceramic substrate, a metal or plastic housing, or the like.

The CPLD 102 may have an interface 106 to exchange one or more signals (e.g., IN and OUT) with an interface 108 of the SERDES 104. The CPLD 102 may have an additional interface 110 to exchange signals (e.g., CNTR, RESP and DATA) externally to the device 100. The SERDES 104 may have an interface 112 to exchange one or more signals (e.g., TX and RX) externally to the device 100.

The signal IN may comprise multiple signals (e.g., AIN, BIN, CIN and DIN), one for each communication channel of the SERDES 104. The signal OUT may comprise multiple signals (e.g., AOUT, BOUT, COUT and DOUT), one for each communication channel of the SERDES 104. The signal TX may comprise multiple signals (e.g., TXA, TXB, TXC and TXD), one for each communication channel of the SERDES 104. The signal RX may comprise multiple signals (e.g., RXA, RXB, RXC and RXD), one for each communication channel of the SERDES 104. The signal DATA may comprise one or more individual data signals flowing into and from the CPLD 102. The signal CNTR may comprise one or more individual control signals received by the CPLD 102. The signal RESP may comprise one or more response signals presented by the CPLD 102.

The CPLD 102 may receive the signal DATA and signal CNTR prior to transmission. The CPLD 102 may perform pre-transmission processing of the signal DATA in accordance with the signal CNTR to produce the signal OUT. The CPLD 102 may present the signal OUT to the SERDES 104. The SERDES 104 may convert the signal OUT from a parallel format into the signal TX having a serial format. The SERDES 104 may then transmit the signal TX.

The SERDES 104 may receive the signal RX at the start of reception. The SERDES 104 may convert the signal RX from the serial format into the signal IN having the parallel format. The SERDES 104 may then present the signal IN to the CPLD 102. The CPLD 102 may perform post-reception processing on the signals IN to produce at least one of the signal DATA and the signal RESP. The CPLD 102 may then present the signal DATA and/or the signal RESP externally to the device 100.

Programming of the device 100 may be performed by any conventional method suitable for the particular implementation of the CPLD 102 and the SERDES 104, if programmable. The programming may be performed during a one-time download process or repeatedly during each power-up, depending upon the capabilities of the CPLD 102 and the SERDES 104. Programming of the CPLD 102 may define the pre-transmission processing and/or the post-reception processing. Programming examples for the SERDES 104 may include, but are not limited to, set-up parameter initialization, encoding/decoding selection, baud rate, parity generate/check, input clocking options, output clocking options, skew alignment, serial signaling rate and multi-communication channel bonding options.

The CPLD 102 may comprise multiple logic block clusters 114 (designated as "CL"), multiple routing channels 116 and multiple I/O banks 118. The logic block clusters 114 may be arranged in a one or two dimensional array. The routing channels 116 may be disposed between horizontally and/or vertically adjacent logic block clusters 114. The I/O banks 118 may be disposed around the outer edge of the CPLD 102. Each of the I/O banks 118 may be coupled to one or more of the routing channels 116.

The routing channels 116 may be dynamically configured to transfer signals among the logic block clusters 114 and the I/O banks 118. For example, the routing channels 116 may convey signals between a particular I/O bank 118 and one or more of the logic block clusters 114. In another example, the routing channels 116 may convey signals among individual logic block clusters 114. The signals may be carried from a source to a destination or multiple destinations by a single routing channel 116 or multiple routing channels 116. The routing channels 116 generally move the signals in the parallel format, although the signals may be moved in the serial format to meet the design criteria of a particular application.

The signal processing may be performed by the logic block clusters 114. One or more logic block clusters 114 may be programmed to operate on one or more signals IN, OUT, DATA, CNTR and/or RESP. The individual logic block clusters 114 may operate independently from each other and/or in cooperation with each other depending upon the programming. Examples of pre-transmission processing may include, but are not limited to, header insertion, byte stuffing, forward error code generation, framing, code piercing, convolution encoding, encryption, data to symbol conversion and block staggering. Examples of post-reception processing may include, but are not limited to, header removal, byte de-stuffing, error detection, error correction, de-framing, pierced code insertion, convolution decoding, decryption, symbol to data conversion and block reorganizing.

Each of the logic block clusters 114 may comprise multiple logic blocks, a programmable interconnect matrix, a channel memory block and multiple cluster memory blocks (not shown). Each of the logic blocks may comprise basic programmable logic functions such as product term arrays, product term allocators and macrocells (not shown). The cluster memory blocks and the channel memory blocks may each comprise any mixture of volatile and non-volatile memory. Other configurations within the CPLD 102 may be implemented to meet the design criteria of a particular application.

Figure 2:
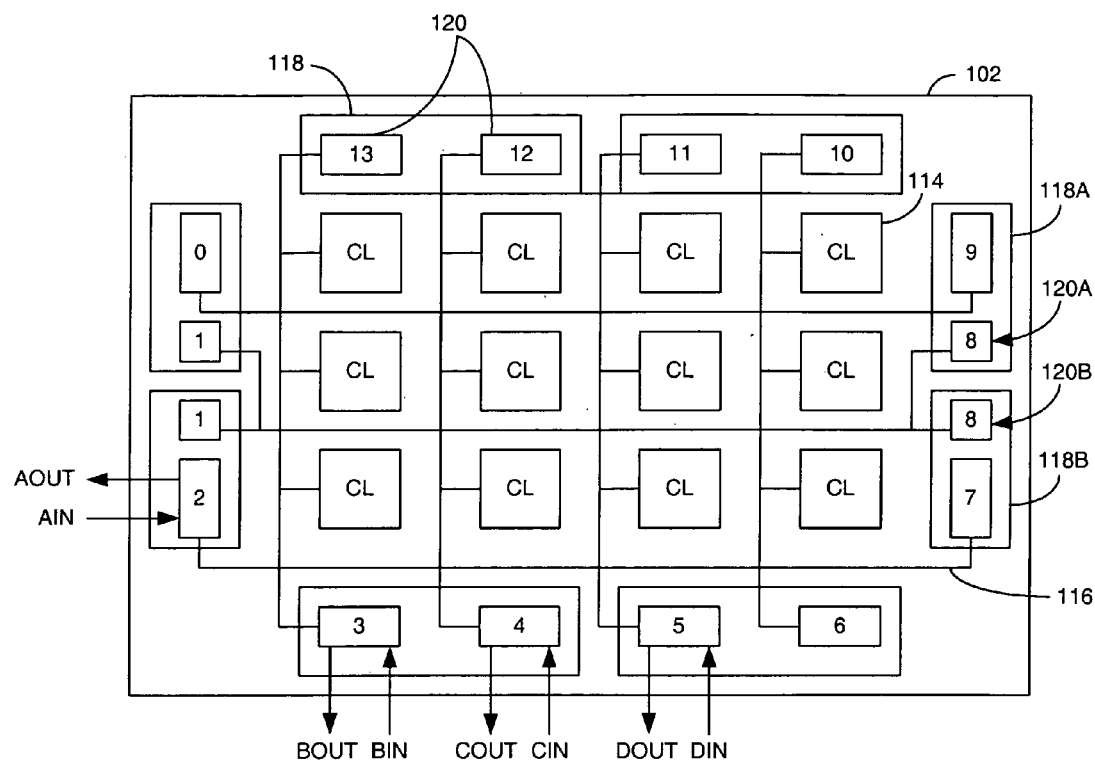
FIG. 2 is a detailed block diagram of a complex programmable logic device.

Referring to FIG. 2, a detailed block diagram of an example circuit implementing the CPLD 102 is shown. Each of the I/O banks 118 generally comprises two or one and a half I/O blocks 120. The FIG. 2 shows an example having fourteen I/O blocks 120 within eight I/O banks 118. Each of the I/O blocks 120 may be associated with one of the routing channels 116. A combination of two half I/O blocks (e.g., 120A and 120B) may also be associated with one of the routing channels 116. Other configurations of I/O blocks 120 within the I/O banks 118 may be implemented to meet the design criteria of a particular application.

Each of the I/O blocks 120, including the half I/O blocks 120, may comprise multiple I/O cells (not shown). Generally, there may be one I/O cell for each bit transferred by the associated routing channel 116. Each of the I/O cells may be programmable to receive or present the bit synchronously or asynchronously. Multiple I/O cells may be operated together to exchange the signals CNTR, RESP, DATA, IN and OUT with the parallel format. Individual I/O cells may be programmed to exchange other signals having a one bit width.

Figure 3:
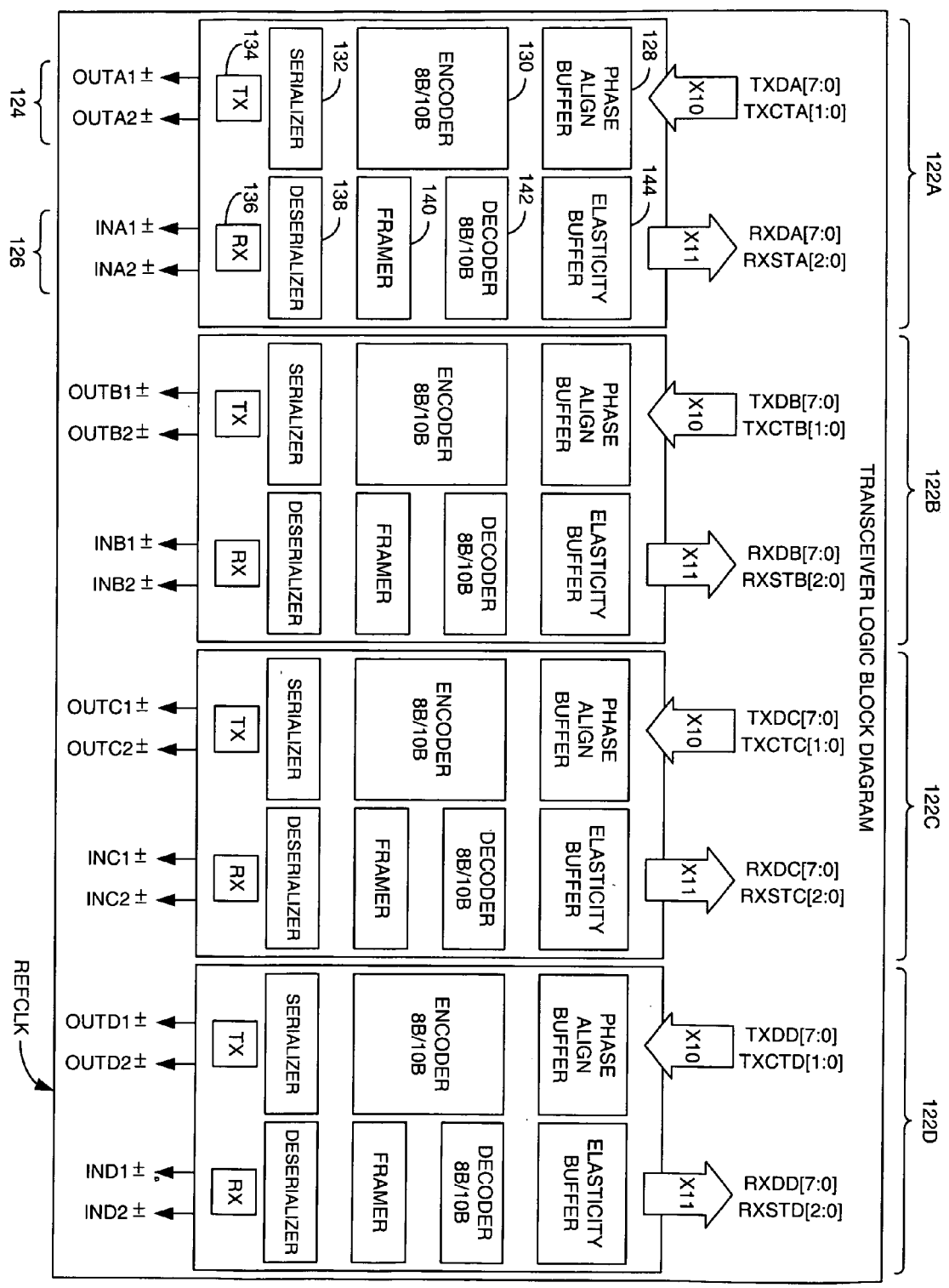
FIG. 3 is a detailed block diagram of a communication die.

Referring to FIG. 3, a detailed block diagram of an example circuit implementing the SERDES 104 is shown. The SERDES 104 generally comprises one or more channels 122. In one example, the SERDES 104 may have four channels 122A–D. Each channel 122 may comprise a transmit communication channel 124 and/or a receive communication channel 126.

The transmit communication channel 124 may receive a signal (e.g., TXDn[7:0], where n identifies the channel A–D). The transmit communication channel 124 may receive another signal (e.g., TXCTn[1:0], where n identifies the channel A–D). The combination of the signal TXDn[7:0] and the signal TXCTn[1:0] may form the signal nOUT, where n identifies the channel A–D.

The signal TXDn[7:0] may be implemented as a data signal having a parallel format and conveying information to be transmitted. The signal TXCTn[1:0] may be implemented as a control signal. The signal TXCTn[1:0] may identify how the signal TXDn[7:0] characters are to be interpreted. In one example, the signal TXCTn[1:0] may be an encoding selection signal that may indicate that the signal TXDn[7:0] is to be encoded as data or a special character code. In another example, the signal TXCTn[1:0] may disable data encoding and in turn may contain two additional bits of the data signal to be transmitted.

The transmit communication channel 124 may present a signal (e.g., OUTn1, where n identifies the channel A–D). The transmit communication channel 124 may present another signal (e.g., OUTn2, where n identifies the channel A–D). One or both of the signals OUTn1 or OUTn2 may be presented as the signal TXn, where n identifies the channel A–D. The signal TXn may have a serial format.

The transmit communication channel 124 may comprise a circuit 128, a circuit 130, a circuit 132 and a circuit 134. The circuit 128 may be implemented as a phase align buffer. The circuit 130 may be implemented as an encoder. The circuit 132 may be implemented as a serializer. The circuit 134 may be implemented as a dual differential line driver.

The phase align buffer 128 may provide synchronization between the signals TXDn[7:0] and TXCTn[1:0] and a clock signal (e.g., REFCLK). The encoder 130 may provide for 8B/10B encoding of the signal TXDn[7:0]. The serializer 132 may convert the encoded data signal from the parallel format to the serial format. The line driver 134 may present the serial data signal as the signals OUTn1 and OUTn2.

The receive communication channel 126 may receive a signal (e.g., INn1, where n identifies the channel A–D). The receive communication channel 126 may receive another signal (e.g., INn2, where n identifies the channel A–D). One or both of the signals INn1 or INn2 may form the signal RX. The signal RX may have a serial format.

The receive communication channel 126 may present a signal (e.g., RXDn[7:0], where n identifies the channel A–D). The receive communication channel 126 may present another signal (e.g., RXSTn[2:0], where n identifies the channel A–D). The combination of the signals RXDn[7:0] and RXSTn[2:0] may form the signal nIN, where n identifies the channel A–D. The signal RXDn[7:0] may be implemented as a data signal having the parallel format and conveying the information received. The signal RXSTn[2:0] may be implemented as a status signal. In one example, the signal RXSTn[2:0] may indicate decoding of the signal RXDn[7:0] as the data signal or the special character code. In another example, the signal RXSTn[2:0] may transfer two bits of the data signal when the decoding is disabled.

The receive communication channel 126 may comprise a circuit 136, a circuit 138, a circuit 140, a circuit 142 and a circuit 144. The circuit 136 may be implemented as a dual differential line receiver. The circuit 138 may be implemented as a deserializer. The circuit 140 may be implemented as a framer. The circuit 142 may be implemented as a decoder. The circuit 144 may be implemented as an elasticity buffer.

The line receiver 136 may receive the signals INn1 and INn2. The deserializer 138 may convert the received signals from the serial format to the parallel format. The framer 140 may detect boundaries of a frame of data and extract the data signal. The decoder 142 may perform 8B/10B decoding of the extracted data signal. The elasticity buffer 144 may provide for buffering of the data signal, status signal and any error detection bits between an output of the decoder 142 and the presentation of the signals RXDn[7:0] and RXSTn [2:0], where n identifies the channel A–D.

Figure 4:
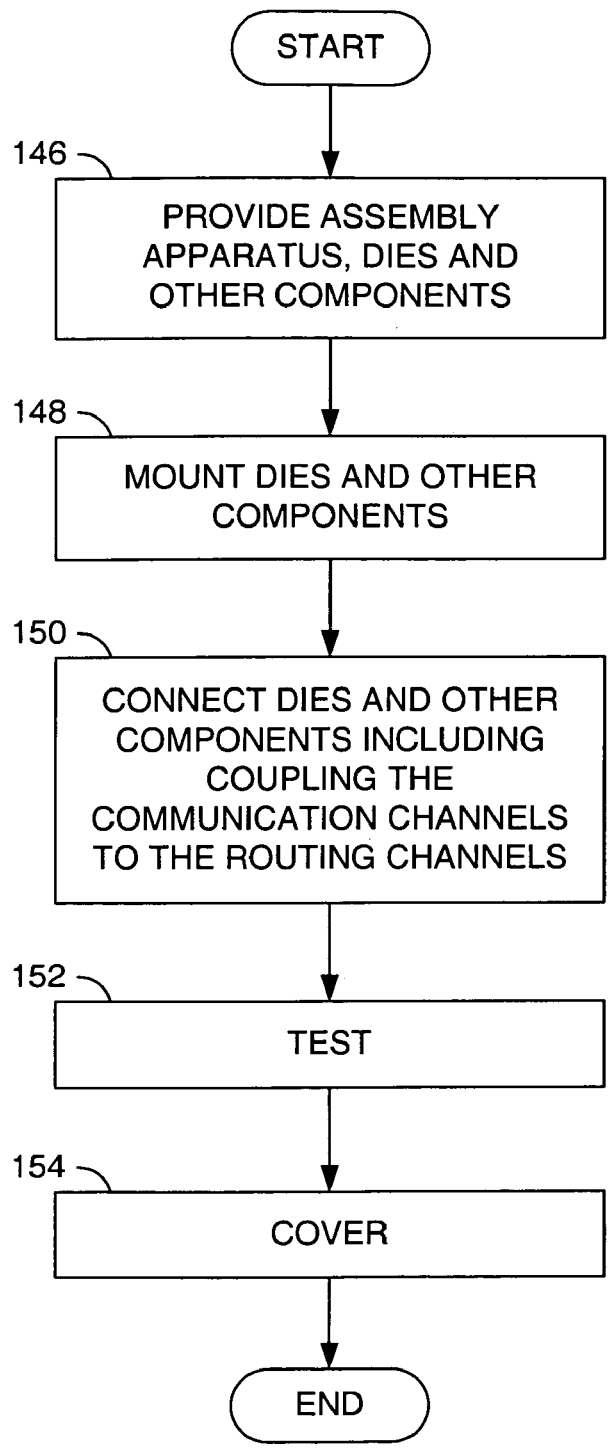
FIG. 4 is a flow diagram of a method of fabricating the device.

Referring to FIG. 4, a flow diagram of a method of fabricating the device 100 is shown. The process may begin by providing the CPLD 102, the SERDES 104, the assembly apparatus 105 and any other die and/or components (e.g., a lid, bonding wire, capacitors, resistors and such) to be used during the assembly (e.g., block 146). The CPLD 102, SERDES 104 and the other components may then be mounted on the assembly apparatus 105 (e.g., block 148). Connections may be created between the CPLD 102, SERDES 104, assembly apparatus 105 and the other components (e.g., block 150). The connections may include coupling the communications channels 124 and 126 of the SERDES 104 with the routing channels 116 of the CPLD 102. The coupling between communication channels 124 and 126 and routing channels 116 may have a one-to-one relationship. Each communication channel 124 and 126 may be coupled through an I/O block 120 to one routing channel 116.

After the connections have been made, the device 100 may be tested (e.g., block 152). If the device 100 passes the testing step, then a cover may be attached to seal the device thus forming a completed package (e.g., block 154). In an alternative process, the cover may be attached prior to testing. Additional steps may be performed on the device 100 after attaching the cover to meet the criteria of a particular fabrication and test process. Optionally, the device 100 may then be programmed to meet the requirements of a particular application specified by a customer. Alternatively, the device 100 may be supplied to the customer unprogrammed.

The various signals of the present invention may be implemented as single-bit or multi-bit signals in a serial and/or parallel configuration.

While the invention has been particularly shown and described with reference to the preferred embodiments thereof, it will be understood by those skilled in the art that various changes in form and details may be made without departing from the spirit and scope of the invention.

What is claimed is:

1. A device comprising:
   an assembly apparatus comprising one of (i) a substrate, and (ii) a housing;
   a programmable logic device directly mounted to said assembly apparatus and comprising (i) a plurality of logic block clusters and (ii) a plurality of routing channels configured to interconnect said logic block clusters; and
   a die mounted directly to said assembly apparatus, directly connected to said programmable logic device and comprising a first communication channel (i) configured to convert between a first serial data signal and a first parallel data signal and (ii) coupled to a first of said routing channels to exchange said first parallel data signal with at least one of said logic block clusters.

2. The device according to claim 1, wherein (i) said die further comprises a second communication channel configured to convert between a second serial data signal and a second parallel data signal and (ii) coupled to a second of said routing channels to exchange said second parallel data signal with at least one of said logic block clusters.

3. The device according to claim 2, wherein (i) said die further comprises a third communication channel configured to convert between a third serial data signal and a third parallel data signal and (ii) coupled to a third of said routing channels to exchange said third parallel data signal with at least one of said logic block clusters.

4. The device according to claim 3, wherein (i) said die further comprises a fourth communication channel configured to convert between a fourth serial data signal and a fourth parallel data signal and (ii) coupled to a fourth of said routing channels to exchange said fourth parallel data signal with at least one of said logic block clusters.

5. The device according to claim 1, wherein said die further comprises a second communication channel (i) configured to convert between a second serial data signal and a second parallel data signal and (ii) coupled to said first routing channel to exchange said second parallel data signal with at least one of said logic block clusters.

6. The device according to claim 1, wherein said first communication channel is further coupled to said first routing channel to receive a control signal from one of said logic block clusters.

7. The device according to claim 6, wherein said control signal is configured as one of (i) a portion of said first parallel signal and (ii) an encoding selection signal.

8. The device according to claim 1, wherein said first communication channel is further coupled to said first routing channel to present a status signal to at least one of said logic block clusters.

9. The device according to claim 8, wherein said status signal is configured as one of (i) a portion of said first parallel signal and (ii) a special character indicator.

10. The device according to claim 8, wherein said die further comprises a second communication channel (i) configured to convert between a second serial data signal and a second parallel data signal and (ii) coupled to said first routing channel to receive said second parallel data signal and a control signal from one of said logic block clusters.

11. A method of fabricating a device comprising the steps of:
   (A) mounting a programmable logic device directly to an assembly apparatus, wherein said programmable logic device comprises (i) a plurality of logic block clusters and (ii) a plurality of routing channels configured to interconnect said logic block clusters and said assembly apparatus comprises one of (i) a substrate and (ii) a housing;

(B) mounting a die directly to said assembly apparatus, wherein said die comprises a first communication channel configured to convert between a first serial data signal and a first parallel data signal; and (C) coupling said first communication channel to said first routing channel to exchange said first parallel data signal between at least one of said logic block clusters and said first communication channel.

12. The method according to claim 11, further comprising the step of coupling a second communication channel of said die to a second of said routing channels to exchange a second parallel data signal between at least one of said logic block clusters and said second communication channel.

13. The method according to claim 12, further comprising the step of coupling a third communication channel of said die to a third of said routing channels to exchange a third parallel data signal between at least one of said logic block clusters and said third communication channel.

14. The method according to claim 13, further comprising the step of coupling a fourth communication channel of said die to a fourth of said routing channels to exchange a fourth parallel data signal between at least one of said logic block clusters and said fourth communication channel.

15. The method according to claim 11, further comprising the step of coupling a second communication channel of said die to said first routing channel to exchange a second parallel data signal between at least one of said logic block clusters and said second communication channel.

16. The method according to claim 11, further comprising the step of coupling said first communication channel to said first routing channel to receive a control signal from one of said logic block clusters.

17. The method according to claim 11, further comprising the step of coupling said first communication channel to said first routing channel to present a status signal to at least one of said logic block clusters.

18. The method according to claim 17, further comprising the step of coupling a second communication channel of said die to said first routing channel to receive a control signal from one of said logic block clusters.

19. A circuit comprising:

means for directly mounting a first programmable die and a second die, said means for directly mounting comprising one of (i) a substrate and (ii) a housing;

means for routing signals among a plurality of logic block clusters in said first programmable die;

means for converting between a first parallel data signal and a first serial data signal in said second die; and means for coupling said means for converting to said means for routing to exchange said first parallel data signal between said means for converting and at least one of said logic block clusters.

20. The device according to claim 5, wherein said first communication channel is a transmit channel and said second communication channel is a receive channel associated with said transmit channel.

21. The device according to claim 4, wherein all of said communication channels are coupled to all of said routing channels through only one side of said programmable logic device.

22. The device according to claim 4, wherein all of said communication channels are coupled to all of said routing channels through a plurality of sides of said programmable logic device.

* * * * *